United States Patent [19]

Sullivan

[11] Patent Number: 4,730,272

[45] Date of Patent: Mar. 8, 1988

[54] AUDIO DELAY SYSTEM

[75] Inventor: Daniel T. Sullivan, Bolton, Mass.

[73] Assignee: Analog and Digital Systems, Inc., Wilmington, Mass.

[21] Appl. No.: 779,787

[22] Filed: Sep. 24, 1985

[51] Int. Cl.[4] .................... G11C 27/00; G06K 15/00
[52] U.S. Cl. ....................................... 365/45; 364/514
[58] Field of Search ......................... 365/45, 189, 233; 364/514

[56] References Cited

U.S. PATENT DOCUMENTS 4,348,754  9/1982  Haynes et al. ................. 364/900
4,391,530  7/1983  Wakabayashi et al. ........ 365/45
4,630,301  12/1986  Hohl et al. ..................... 365/45

Primary Examiner—Terrell W. Fears
Assistant Examiner—Melissa J. Koval

[57] ABSTRACT

Variably delaying an audio signal by storing digital representations of the audio signal at sequential memory locations prescribed by an encoding pointer operating at one clock rate, and reading from the memory at sequential locations prescribed by a decoding pointer operating at the same or a different clock rate, with the difference in clock rates between the pointers prescribing the rate of change of delay. A memory addressing system in which a processor specifies the high-order portion of a memory address and a separate counter, clocked at a much higher rate than the processor, provides the low-order portion of the address.

11 Claims, 6 Drawing Figures

AUDIO DELAY SYSTEM

A microfiche appendix is included in the application, consisting of three sheets, 114 pages.

BACKGROUND OF THE INVENTION

This invention relates to audio delay systems.

Such systems are used in the music industry to produce various sound effects. An example of such a sound effect is the so-called "flange", in which an undelayed audio signal is mixed with a delayed audio signal, and the amount of delay is varied over time. When the two signals are mixed, they constructively interfere with each other at some frequencies to create reinforcements, while destructively interfering with each other at other frequencies to create cancellations. As the delay varies, the reinforcement and cancellation frequencies vary, producing the flange effect.

Typically, the delay is varied by varying the frequency of the clock controlling the rate at which the incoming analog audio signal is digitally encoded, and the rate at which the digitally encoded signal is decoded. For example, to obtain a four-to-one flange, the clock is varied over a four-to-one range. The four-to-one variation in clock frequency varies the time during which the encoded signal is resident in memory, and thus the delay, by the same four-to-one ratio. Because clock frequency variations can typically not be as wide as desired delay variations (because sound fidelity will deteriorate as the result of increased quantization noise), it has typically been necessary to switch into use a variable number of sequentially-arranged memory elements, each of which delays the encoded signal for a predetermined period of time. Switching memory elements into use in this manner creates audible encoding artifacts during the interval required to fill new memory elements with encoded data.

SUMMARY OF THE INVENTION

In general the invention features, in a first aspect, providing variable delay of an audio signal by storing digital representations of the audio signal at sequential memory locations prescribed by an encoding pointer operating at one clock rate, and reading from the memory at sequential locations prescribed by a decoding pointer operating at the same or a different clock rate, with the difference in clock rates between the encoding and decoding pointers prescribing the rate of change of delay. The pointers automatically wrap around from the highest address in the memory to the lowest, to make the memory appear functionally as a ring of memory locations. In preferred embodiments, adaptive delta modulation is used to encode and decode the audio signal; a microprocessor prescribes delay by prescribing a time schedule of changes in the difference in clock rates between the encoding and decoding pointers; different flange effects are provided by storing appropriate schedules of prescribed difference in encoding and decoding clock rates; variation of the addresses between which the decoding pointer skips provides operator adjustment of the beginning and end points of repetitively played back short intervals of music. The invention has the advantage of allowing instantaneous wide variations in delay (e.g., hundred to one) without any degradation in fidelity and without the production of any audible artifacts.

In a second aspect, the invention features a memory addressing system in which a processor specifies the high-order portion of a memory address and a separate counter, clocked at a much higher rate than the processor, provides the low-order portion of the address. An overflow indication is provided the processor when the counter overflows. In preferred embodiments, there is provided an address register for storing the current high-order address portion, a buffer register for storing the next value of the high-order address portion, and means for loading the contents of the buffer register into the address register upon assertion of the overflow indication, and means for loading the buffer register with a new high-order address portion in less than the time interval between successive overflow indications. The invention allows a slow (and thus less expensive) processor to address memory at a higher clock rate than it can itself operate.

In a third aspect, the invention features an audio delay system in which separate encoding and decoding clock signals are generated using an oscillator that provides a high-frequency clock signal, a divider that divides down the high-frequency clock signal to form one of the encoding and decoding clock signals, a pulse adding/removing circuit for adding or removing pulses to or from the high-frequency clock signal, to increase or decrease its frequency, and a second divider for dividing the output of the pulse adding/removing circuit to provide the other of the encoding and decoding clock signals. The invention has the advantage of being capable of providing clock signals separated only slightly in frequency without danger of the clocks locking in synchrony.

DESCRIPTION OF PREFERRED EMBODIMENTS

Drawings

Circuitry

Figure 1:
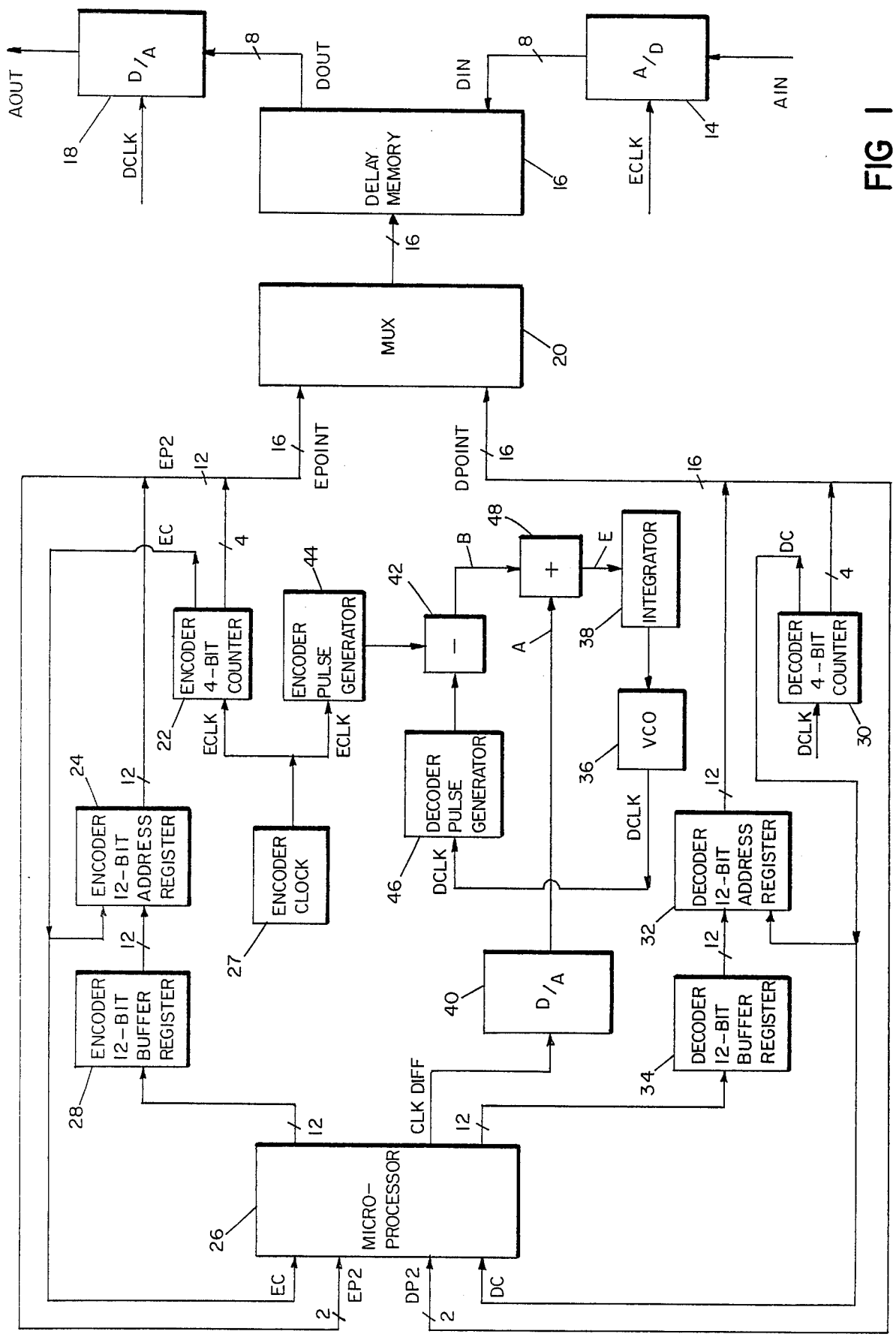
FIG. 1 is a block diagram of a preferred embodiment of the invention.

Referring to FIG. 1, adaptive delta encoder 14 encodes analog input signal AIN to produce digital signal DIN, which is written into delay memory 16 (a 64K byte RAM) at the 16-bit address specified by the encoding pointer EPOINT. Analog output signal AOUT is generated by adaptive delta decoder 18, using digital output signal DOUT, which is read from memory 16 at the 16-bit address specified by the decoding pointer DPOINT. Multiplexer 20 alternately connects DPOINT and EPOINT to the address input of memory 16.

Analog output signal AOUT may be summed with input signal AIN (by circuitry not shown) to produce a flange effect, or it may be used directly.

The encoding pointer EPOINT consists of four low order bits supplied by 4-bit hardware counter 22 and twelve high order bits supplied by 12-bit encoder address register 24. Counter 22 is incremented approximately every 33 microseconds by encoding clock ECLK, supplied by encoding clock circuit 26, consisting of a simple 300 KHz oscillator circuit. Address register 24 is updated every sixteen clock intervals (roughly 500 microseconds) by microprocessor 26 (a conventional 6803 microprocessor) via buffer register 28. When counter 22 overflows, it sends a carry signal EC to address register 24 and microprocessor 26, thereby instructing the address register to load the contents of buffer register 28, which the microprocessor has supplied with the next 12-bit address (ordinarily one bit higher than the last address). The microprocessor has roughly 500 microseconds following receipt of the counter overflow signal EC to supply the buffer register 28 with the next 12-bit address. Providing such a lengthy period makes it possible to use a slow (and inexpensive) microprocessor. The two high order bits of counter 22 are returned to the microprocessor as signal EP2.

Decoding pointer DPOINT is generated in a manner similar to that used to generate the encoding pointer. The low-order four bits of DPOINT are supplied by decoder counter 30; the twelve high order bits, by address register 32. Counter 30 is incremented by decoding clock DCLK, which is generated by voltage-to-frequency converter 36 (see below). Address register 32 is updated by microprocessor 26 via buffer register 34. Overflow line DC from counter 30 is used to instruct address register 32 to load the contents of buffer register 34, and to inform microprocessor 26 that it must reload the buffer register. The two high order bits of counter 30 are returned to the microprocessor as signal DP2.

The frequency of decoding clock DCLK is set by voltage to frequency converter 36, which is driven by the output of integrator 38. The input to the integrator is the sum of signal A, the output of D/A converter 40, and signal B, the output of difference circuit 42. Microprocessor 26 drives the D/A converter, and thus directly establishes the level of signal A. Signal B is a voltage proportional to the difference in frequency of the encoding and decoding clocks; it is generated by difference circuit 42 working in conjunction with pulse generators 44, 46.

Operation

Figure 3:
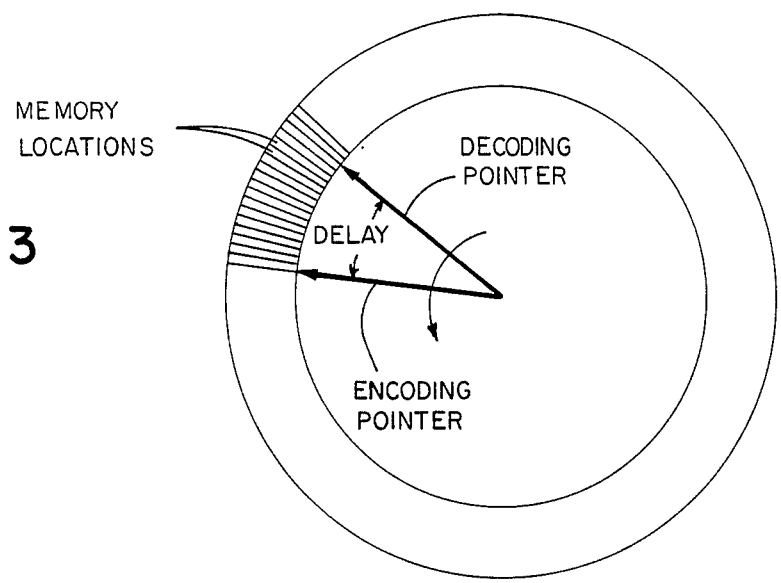
FIG. 3 is a diagrammatic representation of the delay memory of said preferred embodiment.

Operation of the preferred embodiment can be understood by examining FIG. 3, in which memory 16 is shown as a ring of memory locations. Data is written into memory at the address specified by encoding pointer EPOINT, which travels fully around the 64K bits of the memory approximately every 1.7 seconds. Data is read from the memory at the address specified by decoding pointer DPOINT, which trails behind EPOINT by the amount of delay. The speed of the encoding pointer is set by fixed encoding clock ECLK, and is constant (except for drift in the oscillator frequency). Changes in delay are brought about by slightly varying (by a few percent) the decoding clock DCLK relative to the encoding clock ECLK, under control of the microprocessor. For example, a slight slowing down of DCLK will lengthen the delay by causing DPOINT to fall further behind EPOINT.

The microprocessor prescribes the variation between the encoding and decoding clocks using the CLKDIFF signal supplied to A/D converter 40. The CLKDIFF signal prescribes the difference in frequency between the DCLK and ECLK, i.e., the rate of change of the difference in position between the encoding and decoding pointers (as opposed to the actual position of the pointers). During an initialization routine, the microprocessor varies CLKDIFF to find the value that produces the minimum difference between DCLK and ECLK; that value is stored as the zero reference. The CLKDIFF signal is kept at the zero reference whenever the amount of delay is to remain unchanged. A change in delay is brought about by varying CLKDIFF from the zero reference for some interval. The use of an initializing routine to find a zero reference allows the use of imprecise (and thus less expensive) circuits for the D/A converter 40, integrator 38, pulse generator circuits 44, 46, and difference circuit 42. For example, the integrator may have an offset built into its output. Also, the oscillator circuit forming the encoding clock 26 may drift over time as much as 5 to 10% without ill effect. The pulse generator circuits may generate pulses of different widths, so long as the difference remains constant with time and temperature.

Figure 5:
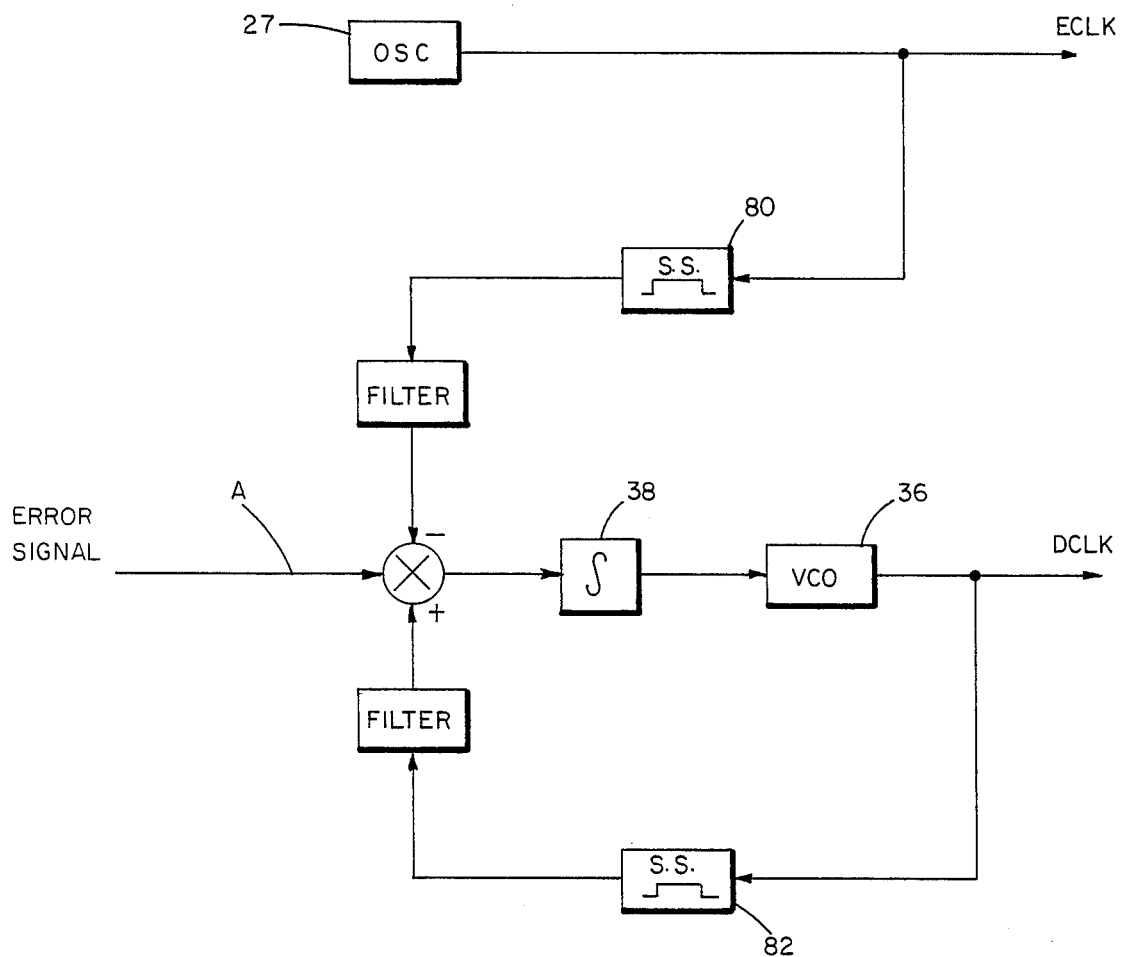
FIG. 5 is a block diagram of the difference and summing circuitry and the integrator shown in FIG. 1.
Figure 6:
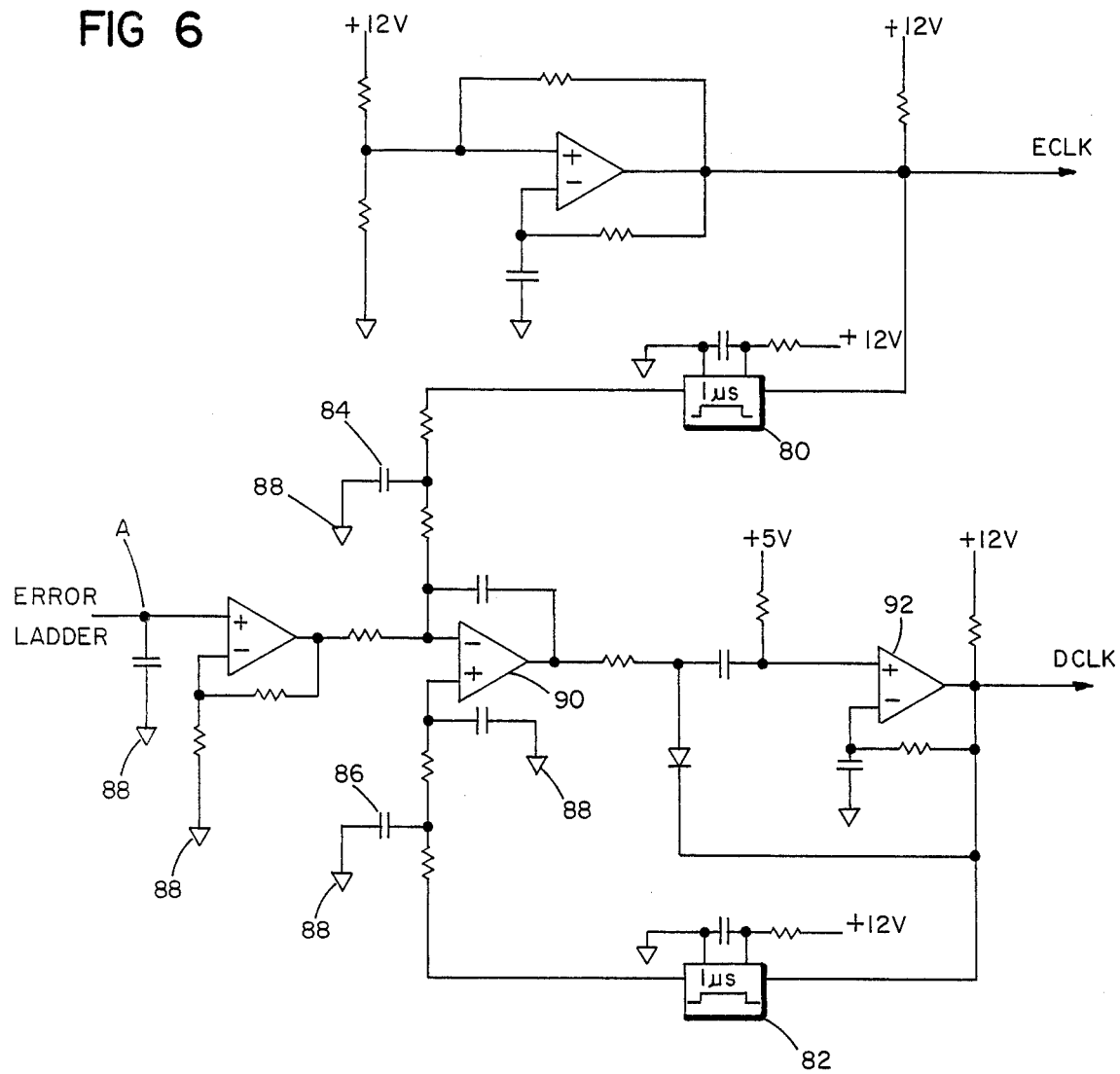
FIG. 6 is a schematic of the preferred implementation of the block diagram of FIG. 5.

A more exact description of the difference circuit 42, summing node 48, integrator 38, pulse generator circuits 44, and voltage-to-frequency converter 36 is given in FIGS. 5 and 6. The difference circuit and summing node are implemented at the input to the same operational amplifier 90 that provides the integration. A comparator 92 and surrounding circuit provides the voltage-to-frequency converter. Referring to FIG. 6, pulse generator circuits 44 are implemented as one-shot pulse generating circuits 80, 82 (implemented as halves of a single dual integrated circuit, each with precision external resistor and capacitor) and filters provided by capacitors 84, 86. The pulse trains generated by the one-shot circuits are filtered to provide an analog voltage representative of the frequency of ECLK and DCLK. The output of D/A converter 40 (more precisely the output of the resistor ladder of the converter) is presented at point A. To minimize noise effects, it is important that all ground connections 88 be separately brought to a common ground node (without intermediate trees or branches).

Figure 2:
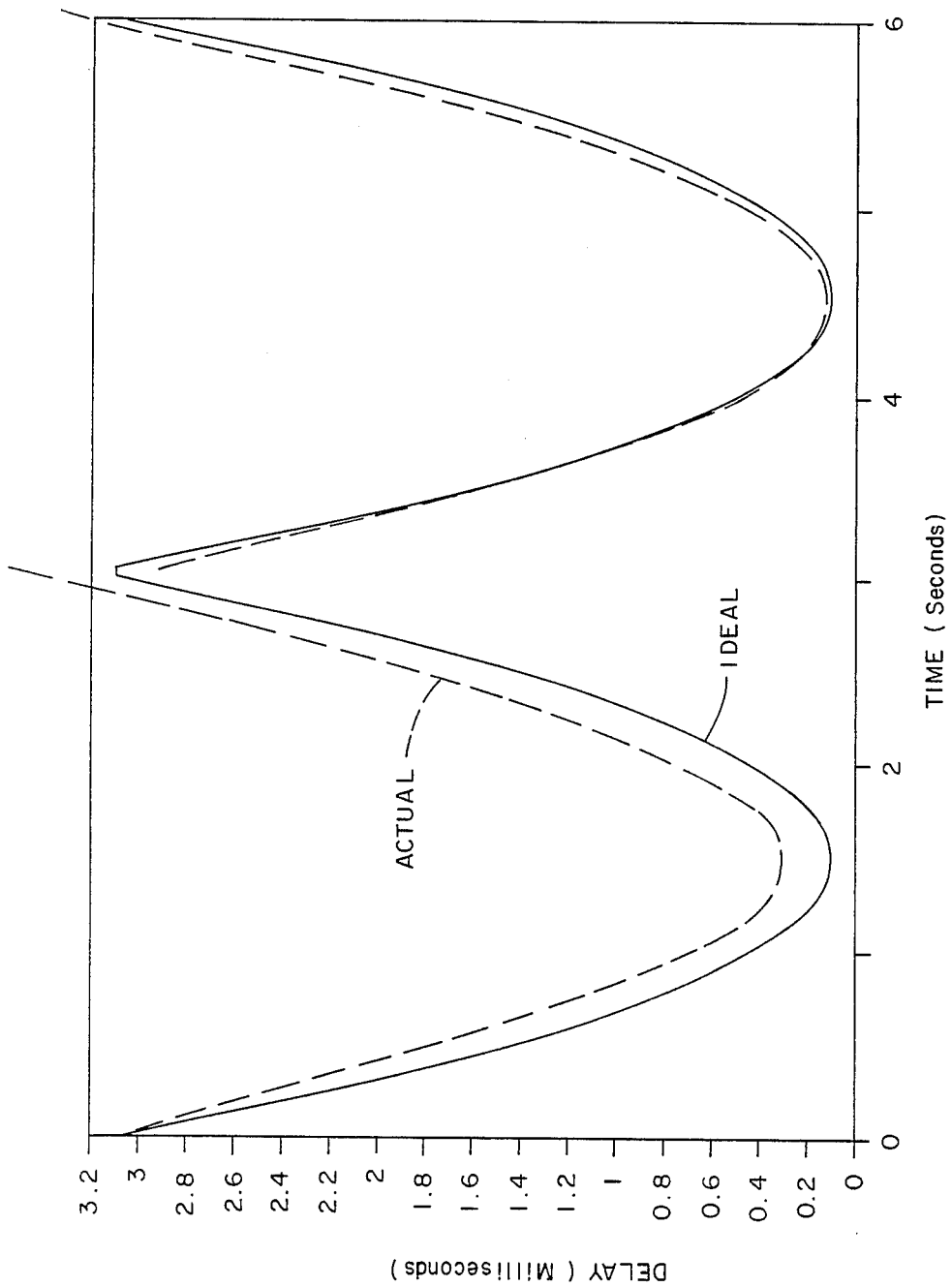
FIG. 2 is a plot illustrating a parabolic flange generated by said embodiment.

To create a flange effect, such as the parabolic flange shown in FIG. 2 (in which delay varies from about 3.0 milliseconds to a minimum of about 100 microseconds, and back to 3.0 milliseconds, roughly every three seconds), the CLKDIFF signal is varied over time according to a predetermined schedule. CLKDIFF is a maximum at the beginning and end of each cycle, at which times the slope of the delay curve in FIG. 2 is a maximum; CLKDIFF is a minimum at the middle of each cycle when the slope of the delay curve is at a minimum.

Because the shape of the delay curve is produced in an open loop manner—i.e., by specifying a schedule of changes in decoding clock frequency over time—the actual delay curve generated tends to vary somewhat randomly from that shown in FIG. 2. In particular the downward and upward halves of the parabolic curve in FIG. 2 may in practice not be perfectly symmetrical. For example, the curve may end up with the shape shown in dashed lines. The microprocessor has a routine for detecting the variation in the turning point of the flange (the closest approach to zero delay) from the desired turning point, and for varying the starting point to minimize the variation. In the example shown, the microprocessor would, after detecting that the actual delay variation was as shown in dashed lines, reduce the starting delay by about 200 microseconds to bring the turning point closer to the desired 100 microseconds from the roughly 300 microseconds achieved in the prior cycle. The result of this adjustment from cycle to cycle is a pleasant sounding randomness in the degree of flanging.

The schedule for varying CLKDIFF is determined by the microprocessor using the measured zero reference and the desired degree of delay variation (set at the control panel). An iterative procedure is followed in which changes to CLKDIFF are made over time, the resulting change in delay is calculated (assuming an ideal D/A converter and integrator), and the schedule of changes to CLKDIFF is altered until the desired delay changes are achieved.

During a flange cycle, the microprocessor monitors the delay between the two pointers EPOINT and DPOINT to assure that the delay never becomes so small as to allow the pointers to crossover, i.e., for the decoding pointer DPOINT to get ahead of the encoding pointer. If such an event took place, the decoded signal would instantaneously go from zero delay to approximately 1.7 seconds delay, something generally undesirable because of the musical discontinuity produced. For monitoring the separation between the two pointers, the microprocessor has available to it all but the lowest order two bits of the pointer addresses. If the microprocessor determines that a crossover is about to occur, it immediately alters the CLKDIFF signal sufficiently to slow down the decoding pointer and prevent crossover.

Variation in CLKDIFF brings about a change in the decoding clock DCLK by means of a feedback circuit. When CLKDIFF changes, output A of D/A converter 40 changes, thereby changing the input to integrator 38. The output of integrator 38 then begins to change, bringing about a change in DCLK, thereby, in turn, changing output B of difference circuit 42. Eventually, if no further change is made to CLKDIFF, a new equilibrium point will be reached in which DCLK is changed sufficiently to exactly balance the change in CLKDIFF, at which time the input to the integrator will have returned to zero.

This feedback arrangement prevents the encoding and decoding clocks from "locking up" with one another even when they are operating at only slightly different frequencies. Without the feedback—e.g., if the decoding clock was set directly by the CLKDIFF signal from the microprocessor—noise generated at the instant that one clock changed state would tend to cause the other clock to change state ahead of its prescribed time, thereby locking the two clocks in synchrony. The feedback circuit prevents this from happening, because if such a lock up begins the input to integrator 38 will remain constant, thereby causing the integrator output to grow until the clocks are forced out of synchrony.

The preferred embodiment may also be used to produce what are known in the music industry as "repeats". In this mode of operation, a panel switch (e.g., a button) is used by the operator to initiate storage of 1.7 seconds of music. The microprocessor saves the 0.2 seconds of music preceding depression of the panel switch and the following 1.5 seconds. After this 1.7 seconds of music has been stored in the memory, the decoding pointer DPOINT can be made to move around the memory in a variety of ways to allow any portion of the recorded 1.7 second interval to be repeated. For example, using panel controls the operator may move the starting point of the repeated sequence to the 0.1 second mark (i.e., 0.1 seconds before he depressed the panel switch) and the ending point to the 1.5 second mark. To accomplish this, the microprocessor causes the decoding pointer to skip from the address corresponding to 1.5 seconds immediately to the address corresponding to 0.1 seconds, leaving out the intervening 0.3 seconds of music.

Typically, the operator will set either the beginning or end of the interval to capture a desired sound, and then vary the other boundary until a point is found at which the wrap-around transition (in the example, the jump from the 1.5 second point ot the 0.1 second point) produces an acceptably minimal "click" in the sound. The invention works particularly well in this application because it allows the operator to vary the starting and stopping points of the repeated sound without introducing any sound artifacts (e.g., "clicks") other than the one inherent in the wrap-around transition itself.

In applications in which the delay is not varied, the encoding clock ECLK may be switched into use for both the encoding and decoding pointers.

As the amount of delay is controlled by a microprocessor, it is possible to program a sequence of different delay effects (e.g., a parabolic flange, followed by an echo (i.e., a constant delay), followed by a less pronounced parabolic flange, and so on). Front panel controls (not shown) may be provided for such programming. Because the amount of delay can be instantaneously varied from nearly zero to 1.7 seconds, it is possible to switch between effects without introducing "clicks" or other artifacts (other than those produced solely by the prescribed changes in delay).

Figure 4:
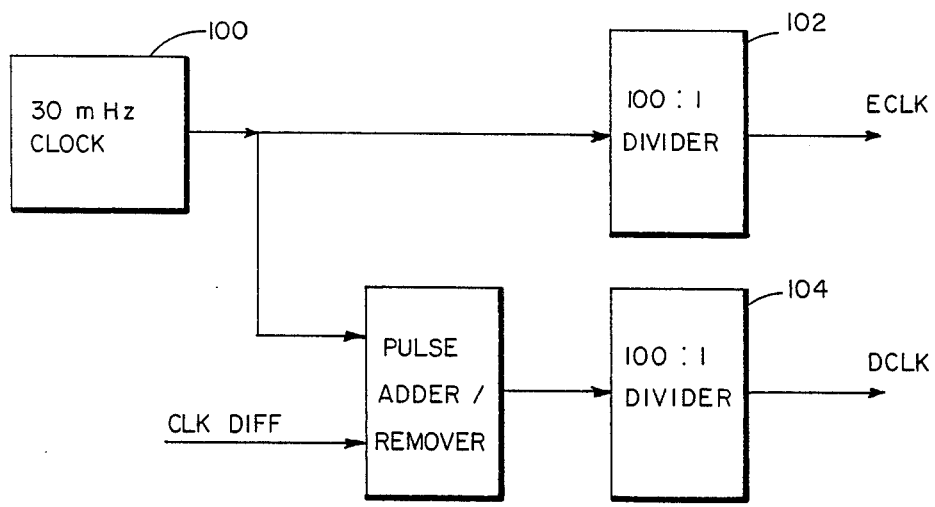
FIG. 4 is a block diagram of another preferred embodiment of said invention.

Another embodiment of the invention is shown in FIG. 4. This embodiment differs from the embodiment shown in FIG. 1 in the manner in which the encoding and decoding clocks ECLK, DCLK are generated. Instead of the simple 300 KHz oscillator for ECLK and feedback circuit for DCLK, there is a single high frequency clock 100 (30 MHz crystal oscillator) on which both ECLK and DCLK are based. ECLK is generated by dividing the 30 MHz clock using 100:1 divider 102, the output of which is the desired 300 KHz encoding clock ECLK. The decoding clock is generated using an identical 100:1 divider 104, but prior to entering the divider, the clock signal passes through a circuit 106 adapted to add or remove pulses from the 30 MHz pulse stream. The frequency of added or removed pulses is proportional to CLKDIFF, set by the microprocessor. For example, to slow DCLK by 0.1% from ECLK, it is necessary to remove 0.1% of the pulses in the 30 MHz pulse stream, i.e., every thousandth pulse. This clock circuit is not susceptible to locking up, but does require a somewhat more expensive oscillator than the circuit of FIG. 1, as well as the addition of the divider circuits and pulse adding/removing circuit.

A set of schematics and a listing of microprocessor software for the preferred embodiment of FIG. 1 are provided in the appendix. The listed software is stored in two 2782 EPROMs shown in the schematics. The first column in the software listing is the address; the second is the data stored at that address; the third is the symbol name; the fourth is the instruction mnemonic.

Other embodiments of the invention are within the scope of the following claims.

What is claimed is:

1. A system for variably delaying an audio signal, said apparatus comprising memory means for storing a sequence of numbers comprising digital representations of consecutive portions of said audio signal, addressing means for generating encoding and decoding pointers for accessing said memory means, memory writing means for writing said numbers at sequential memory locations prescribed by said encoding pointer, memory reading means for reading numbers from said memory at sequential locations prescribed by said decoding pointer, clock means for generating encoding and decoding clock signals, said addressing means including means for incrementing said encoding pointer in response to said encoding clock and for incrementing said decoding pointer in response to said decoding clock, and for shifting said encoding and decoding pointers to a predetermined low address in said memory (e.g., the zero address) after a predetermined higher address (e.g., the highest address) is reached, means for varying the frequency of said decoding clock relative to said encoding clock, thereby to vary address separation between said encoding and decoding pointers and the amount of delay of said audio signal.

2. The system of claim 1 further comprising encoding means for encoding said audio signal to form said sequence of numbers, said encoding means generating a new said number in response to said encoding clock, and decoding means for decoding said numbers read from said memory means to form a decoded audio signal, said decoding means decoding a new number in response to said decoding clock.

3. The system of claim 2 wherein said encoding and decoding means comprise means for adaptive delta encoding and decoding, said numbers are individual bits, and said encoding and decoding pointers are incremented by a single bit at each encoding and decoding clock pulse, respectively.

4. The system of claim 1 wherein said means for varying comprises means for prescribing the difference in frequency between said encoding and decoding clocks.

5. The system of claim 4 further comprising a processor and program storage means for storing software controlling said processor, said processor and software prescribing said difference in frequency.

6. The system of claim 4 further comprising means for prescribing a programmed sequence of frequency differences over time to create a variation in delay useful for providing a flange effect.

7. The system of claim 1 further comprising means for indefinitely holding in said memory means a sequence of said numbers representing an interval of said audio signal, means for repetitively reading all or a portion of said numbers from said memory means to provide a repetitive playback of said stored interval of said audio signal, means for varying the beginning and end points of said read portion thereby to vary the beginning and end points of said repetitively played back audio signal, said means comprising means for selecting two addresses between which said decoding pointer skips during each repetition of said stored interval.

8. A memory addressing system comprising a processor for prescribing the high-order portion of a memory address, a counter for prescribing the low-order portion of said memory address, processor clock means for operating said processor at a processor clock rate, counter clock means for operating said counter at a counter clock rate, said counter clock rate being at least four times said processor clock rate, means for providing an overflow indication to said processor when said counter has overflowed, means for incrementing said high-order address portion in response to said overflow indication.

9. The system of claim 8 further comprising an address register for storing said high-order address portion, a buffer register for storing the next value of said high-order address portion, means for loading said address register with the contents of said buffer register upon assertion of said overflow indication, and means for loading said buffer register with a new value of said high-order address portion in less than the time interval between successive overflow indications.

10. The system of claim 8 wherein said counter clock rate is at least eight times said processor clock rate.

11. The system of claim 8 wherein said system forms part of a system for variably delaying an audio signal, said system comprising memory means for storing a sequence of numbers comprising digital representations of consecutive portions of said audio signal, said first-mentioned counter providing the low-order portion of an encoding pointer for addressing said memory means, a second said counter providing the low-order portion of a decoding pointer for addressing said memory means, memory writing means for writing said numbers at sequential memory locations prescribed by said encoding pointer, memory reading means for reading numbers from said memory at sequential locations prescribed by said decoding pointer, said first-mentioned counter being operated at an encoding clock rate, said second counter being operated at a decoding clock rate, said processor providing the high-order portions of said encoding and decoding pointers, said encoding and decoding clock rates each being at least four times greater than said processor clock rate.

* * * * *